(12) United States Patent
Petigny et al.

(10) Patent No.: US 11,867,563 B2
(45) Date of Patent: Jan. 9, 2024

(54) HIGH DYNAMIC DEVICE FOR INTEGRATING AN ELECTRIC CURRENT

(71) Applicant: LYNRED, Palaiseau (FR)

(72) Inventors: Roger Petigny, Villages du Lac de Paladru (FR); Patrick Robert, Reaumont (FR)

(73) Assignee: LYNRED, Palaiseau (FR)

( * ) Notice: Subject to any disclaimer, the term of this patent is extended or adjusted under 35 U.S.C. 154(b) by 790 days.

(21) Appl. No.: 16/962,642

(22) PCT Filed: Feb. 27, 2019

(86) PCT No.: PCT/EP2019/054805
§ 371 (c)(1),
(2) Date: Jul. 16, 2020

(87) PCT Pub. No.: WO2019/166465
PCT Pub. Date: Sep. 6, 2019

(65) Prior Publication Data
US 2021/0072087 A1    Mar. 11, 2021

(30) Foreign Application Priority Data
Mar. 2, 2018 (FR) ...................................... 1851818

(51) Int. Cl.
*G01J 5/00* (2022.01)
*G01J 5/24* (2006.01)
(Continued)

(52) U.S. Cl.
CPC ................ *G01J 5/24* (2013.01); *H03F 1/086* (2013.01); *H03F 3/005* (2013.01); *H03F 3/70* (2013.01);
(Continued)

(58) Field of Classification Search
CPC .................................................. G01N 21/6458
See application file for complete search history.

(56) References Cited

U.S. PATENT DOCUMENTS

2017/0111015 A1* 4/2017 Robert ...................... G01J 5/24
2017/0364180 A1   12/2017 Wen et al.

FOREIGN PATENT DOCUMENTS

| EP | 3140906 A1 | 3/2017 |
| WO | WO-2015170041 A1 | 11/2015 |
| WO | WO-2017135815 A1 | 8/2017 |

OTHER PUBLICATIONS

International Search Report issued in PCT Patent Application No. PCT/EP2019/058405 dated Mar. 22, 2019.
(Continued)

*Primary Examiner* — Dani Fox
(74) *Attorney, Agent, or Firm* — MARSHALL, GERSTEIN & BORUN LLP

(57) ABSTRACT

A device of integration of an electric current received on an integration node, includes an operational amplifier, an integration capacitor, and a circuit for modifying an output voltage of the operational amplifier formed by a charge transfer circuit configured to be connected on the integration node and to transfer charges into the integration capacitor. The device also includes a comparison circuit configured to trigger the modification circuit at least once during the integration duration, and a storage circuit configured to store the number of triggerings which have occurred during the integration duration. The received electric current is calculated according to the output voltage as well as to the number of triggerings multiplied by the modification of the output voltage induced by the modification circuit.

12 Claims, 9 Drawing Sheets

(51) Int. Cl.
*H03F 1/08* (2006.01)
*H03F 3/00* (2006.01)
*H03F 3/70* (2006.01)

(52) U.S. Cl.
CPC .... *H03F 2200/264* (2013.01); *H03F 2200/78* (2013.01)

(56) References Cited

OTHER PUBLICATIONS

Mottin et al., "Uncooled amorphous silicon technology enhancement for 25?m pixel pitch achievement," Infrared Technology and Application XXVIII, SPIE, vol. 4820E (2003).
"The Design of High-Performance Analog Circuits on Digital CMOS Chips," IEEE journal of solid-state circuits, vol. sc-20, No. 3 (1985).

* cited by examiner (State of the art)

(State of the art)

(State of the art)

(State of the art)

(State of the art)

HIGH DYNAMIC DEVICE FOR INTEGRATING AN ELECTRIC CURRENT

DOMAIN OF THE INVENTION

The invention relates to electric current integration, particularly to integrators comprising a capacitor connected in counter-feedback on an operational amplifier and supplying an electric voltage which is a function of the charges received and stored in the capacitor.

The invention especially, but not exclusively, applies to the detection of an electromagnetic radiation, and particularly infrared radiation. It more specifically applies to thermal imaging by means of array detectors formed of an array of microbolometers, be it conventional imaging intended to form thermal images, or thermal imaging intended to obtain temperature measurements.

The invention thus aims, in particular, at an integrator with a high readout dynamic range, that is, an integrator capable of measuring an electric current corresponding to a small quantity of electric charges and of measuring an electric current corresponding to a large quantity of electric charges.

In particular, in the context of array detection, the invention aims at the forming of images containing the maximum useful data, obtained from scenes having a high flow dynamic range, that is, characterized by large differences in the energy emitted between the various points of the scene, and more specifically a particularly significant temperature difference between "cold" areas and "hot" areas as concerns heat detectors, in the order of several hundreds of degrees Celsius.

BACKGROUND

The developments discussed hereafter are based on the specific case of microbolometric-type heat detectors, in that they especially benefit from the advantages provided by the invention. It should however be specified that the issues expressed in this context apply to any type of device generating electric charges to be measured. In particularly, what is described hereafter applies to all electromagnetic radiation detectors, be they detectors operating, for example, in the visible range, or detectors operating in infrared or beyond in so-called "Terahertz" bands.

Similarly, the invention benefits to detectors sensitive to electromagnetic waves, such as heat detectors, for example, of bolometric and capacitive type, or to coupling antennas for the thermal and Terahertz ranges, as well as to so-called quantum detectors, sensitive to electromagnetic energy corpuscles, among which detectors operating from as soon as the X, UV, visible, and infrared bands can be mentioned.

In the context of the present invention, the term "detector" may be understood as designating any system intended to generate an electric signal in relation with a unit, linear, or two-dimensional distribution of any phenomenon.

In the field of so-called "thermal" infrared detectors, it is known to use monodimensional or bidimensional arrays of elements sensitive to infrared radiation, capable of operating at ambient temperature, that is, requiring no cooling at very low temperatures, conversely to detection devices called "quantum detectors", which require an operation at very low temperature, typically that of liquid nitrogen.

A thermal infrared detector conventionally uses the variation of a physical quantity of a so-called "thermometric" or "bolometric" material, according to its temperature. Most currently, this physical quantity is the electric resistivity of said material, which is strongly temperature-dependent. The unit sensitive elements of the detector, or "bolometers", are usually in the form of membranes, each comprising a layer of a thermometric material, and suspended above a substrate, generally made of silicon, via support arms having a high thermal resistance, the array of suspended membranes being usually called "retina". Such membranes especially implement a function of absorption of the incident radiation, a function of conversion of the power of the absorbed radiation into thermal power, and a thermometric function of conversion of the generated thermal power into a variation of the resistivity of the thermometric material, such functions being implementable by one or a plurality of distinct elements. Further, the support arms of the membranes are also conductive and connected to the thermometric layer thereof. Means for sequentially addressing and biasing the thermometric elements of the membranes and means for forming electric signals usable in video formats are usually formed in the substrate having the membranes suspended thereabove. The substrate and the integrated means are commonly called "readout circuit".

To compensate for the temperature drift of the detector, a solution generally implemented is to arrange, in the electronic circuit for forming the signal in relation with the temperature of the imaging bolometers (thus called since they are sensitive to the incident electromagnetic radiation), an element for compensating the focal plane temperature (FPT), itself bolometric, that is, having its electric behavior following the substrate temperature, but remaining essentially insensitive to radiation. This result is for example obtained by means of bolometric structures provided, by construction, with a lower thermal resistance towards the substrate, and/or by masking these structures behind a shield opaque to thermal radiation. The use of such compensation elements further has the advantage of eliminating most of the so-called common-mode current originating from imaging or "active" bolometers.

FIG. 1 is an electric diagram of a bolometric detector 10 with no temperature regulation, or "TECless" detector, of the state of the art, comprising a common-mode compensated structure. FIG. 2 is an electric diagram of a circuit implemented to form a read signal of a bolometer of the common-mode compensated detector. Such a detector is for example described in document: "Uncooled amorphous silicon technology enhancement for 25 μm pixel pitch achievement"; E. Mottin et al, Infrared Technology and Application XXVIII, SPIE, vol. 4820E.

Detector 10 comprises a two-dimensional array 12 of identical unit bolometric detection elements 14, or "pixels", each comprising a sensitive resistive bolometer 16 in the form of a membrane suspended above a substrate, such as previously described, having electric resistance $R_{ac}$.

Each bolometer 16 is connected by one of its terminals to a constant voltage VDET, especially the ground of detector 10, and by its other terminal to a MOS biasing transistor 18 operating in saturated state, for example, an NMOS transistor, setting voltage $V_{ac}$ across bolometer 16 by means of a gate control voltage GAC.

If A designates the node corresponding to the source of MOS 18 and if VA is the voltage at this node, which depends on gate voltage GAC, voltage $V_{ac}$ is then equal to $V_{ac}$=VA−VDET. Pixel 14 also comprises a selection switch 20, connected between MOS transistor 18 and a node S provided for each column of array 12, and driven by a control signal Select, enabling to select bolometer 16 for the reading thereof. Transistor 18 and switch 20 are usually formed in the substrate under the influence of the membrane of bolometer 16. Elements 16 and 18 form a so-called detection branch.

Particularly, since the pixels are identical and voltage VDET, on the one hand, and voltage GAC, on the other hand, are identical for all pixels, bolometers 16 are thus voltage-biased under the same voltage $V_{ac}$. Further, gate voltage GAC being constant, voltage $V_{ac}$ is thus also constant.

Detector 10 also comprises, at the foot of each column of array 12, a compensation structure 22, also usually called "skimming" structure. As previously described, the value of the electric resistance of detection bolometers 16 is mainly dictated by the substrate temperature. The current flowing through a detection bolometer 16 thus comprises a significant component which depends on the substrate temperature and is independent from the observed scene. Compensation structure 22 has the function of delivering an electric current for purposes of partial or total compensation of this component.

Structure 22 comprises a compensation bolometer 24, of electric resistance $R_{cm}$, made insensitive to the incident radiation originating from the scene to be observed. Bolometer 24 is constructed by means of the same thermometric material as bolometer 16, but has a very low thermal resistance towards the substrate. For example:
- the resistive elements of compensation bolometer 24 are directly formed in contact with the substrate, or
- bolometer 24 comprises a membrane similar to that of detection bolometers 16 suspended above the substrate by means of structures having a very low thermal resistance, or also
- compensation bolometer 24 comprises a membrane and support arms substantially identical to those of detection bolometers 16 and a material which is a good thermal conductor fills the space between the membrane of bolometer 24 and the substrate.

The electric resistance of bolometer 24 is thus essentially dictated by the substrate temperature, bolometer 24 then being said to be "thermalized" to the substrate.

Bolometer 24 is connected at one of its terminals to a positive constant voltage VSK, and compensation structure 22 further comprises a MOS biasing transistor 26 operating in saturated state, having a polarity opposite to that of transistors 18 of detection pixels 14, for example, a PMOS transistor, setting the voltage $V_{cm}$ across bolometer 24 by means of a gate control voltage GCM, and connected between the other terminal of compensation bolometer 24 and node S.

Calling B the node corresponding to the drain of MOS transistor 26 and VB the voltage at this node, voltage $V_{cm}$ is then equal to $V_{cm}$=VSK−VB. Elements 24 and 26 form a so-called compensation branch common to each column.

The value of the common-mode compensation current is defined by the value of resistance $R_{cm}$ of bolometer 24 and of the biasing parameters thereof.

Detector 10 also comprises, at the foot of each column of array 12, an integrator 28 of CTIA type ("Capacitive TransImpedance Amplifier"), for example comprising an operational amplifier 30 and a single capacitor 32 of fixed capacitance $C_{int}$ connected between the inverting input and the output of amplifier 30. The inverting input and the non-inverting input of the latter are further respectively connected to node S and to a positive constant voltage VBUS. Voltage VBUS thus forms a reference for the output signals, and is between VDET and VSK. A switch 34 driven by a signal Reset is also provided in parallel with capacitor 32, for the discharge thereof. The outputs of CTIAs 28 are eventually for example connected to respective sample-and-hold circuits 36 for the delivery of voltages $V_{out}$ of CTIAs in multiplexed mode by means of a multiplexer 38 towards one or a plurality of series output amplifier(s) 40. It may also be integrated at the output of the digitizing means by analog-to-digital converters (ADC).

Finally, detector 10 comprises a sequencing unit 42 controlling the different previously-described switches.

In operation, array 12 is read row by row. To read from a row of array 12, the switches 20 of pixel row 14 are turned on and the switches 20 of the other rows are turned off. The successive reading of the assembly of rows of array 12 forms a frame.

For the reading of a bolometer 16 of a row of array 12 selected for the reading, after a phase of discharge of the capacitors of the CTIAs at the foot of the column, achieved by the turning on of switches 34 by means of signal Reset, followed by their turning off, a circuit such as shown in FIG. 2 is thus obtained for each pixel in the row being read.

A current $I_{ac}$ flows through detection bolometer 16 of the pixel under the effect of its voltage biasing by MOS transistor 18, and a current $I_{cm}$ flows through compensation bolometer 24 of the compensation structure under the effect of its voltage biasing by MOS transistor 26. These currents are subtracted from each other at node S, and the resulting current difference is integrated by CTIA 28 during a predetermined integration period $T_{int}$. The output voltage $V_{out}$ of CTIA 28 thus is a measurement of the variation of the resistance of detection bolometer 16 caused by the incident radiation to be detected since the non-useful part of current $I_{ac}$ depending on the substrate temperature is at least partly compensated for by current $I_{cm}$ specifically generated to reproduce this non-useful part.

Assuming that the electric resistances of active bolometer 16 and of compensation bolometer 24 are not significantly modified on biasing thereof by a self-heating phenomenon, and that CTIA 28 does not saturate, the output voltage $V_{out}$ of the integrator at the end of integration time $T_{int}$ can be expressed by relation:

$$V_{out} = V_{bus} + \frac{1}{C_{int}} \int_0^{\Delta T_{int}} (i_{ac} - i_{cm}) dt = \frac{(i_{ac} - i_{cm}) \cdot T_{int}}{C_{int}} + VBUS \quad (1)$$

As known per se, a CTIA has a fixed electric output dynamic range or "readout" dynamic range. Below a first quantity of electric charges received as an input, the CTIA supplies a low fixed voltage, called "low saturation voltage" ($V_{satL}$). Similarly, above a second quantity of electric charges received as an input, the CTIA supplies a high fixed voltage, called "high saturation voltage" ($V_{satH}$). Relation (1) expresses the linear behavior of the CTIA, when it receives a quantity of electric charges greater than the first quantity of electric charges, and smaller than the second quantity of electric charges. The readout dynamic range is essentially determined by the value of capacitance $C_{int}$ of capacitor 32. Particularly, when this capacitance is fixed, that is, constant along time, the readout dynamic range of the CTIA is also fixed.

By convention, in the context of the invention, low and high saturation voltages $V_{satL}$ and $V_{satH}$ are the limits between which the CTIA supplies an output considered as linear, even if it is generally capable of supplying lower or higher voltages than these limits.

Further, the capacitance of the integration capacitor also determines the sensitivity, or more exactly the responsivity of the detector. The responsivity of a detector is defined by the variation of output signal $V_{out}$ in relation with the variation of the input signal (scene temperature $T_{scene}$), that is, $dV_{out}/dT_{scene}$.

The observable dynamic range of the scene, or "scene dynamic range" is defined by the maximum temperature difference in a scene which causes no saturation of the output signals of the CTIAs or, in other words, the difference between the highest temperature inducing no high saturation of the CTIAs and the lowest temperature inducing no low saturation of the CTIAs. The sensitivity (responsivity) of a detector accordingly is the ability thereof to detect the details of a scene, while the scene dynamic range of the detector is its ability to transcribe with no distortion very large temperature variations in a scene. It is thus difficult to simultaneously optimize these two contradictory quantities with a fixed capacitance of the integration capacitor.

To solve this problem, it is known from document EP 3 140 906 to use a reversing of the integration capacitor during integration period $T_{int}$ to modify output voltage $V_{OUT}$ and extend the readout dynamic range of the CTIA. An example of implementation of this document is described in relation with FIG. 3 of the state of the art.

This drawing describes an integration device 60 according to the invention comprises a CTIA-type integrator comprising an operational amplifier 62 and a signal capacitor 64, of fixed capacitance $C_{int}$, connected between the inverting input (−) and the output of amplifier 62. The non-inverting input (+) thereof is connected to a constant positive voltage VBUS and the inverting input (−) is connected to the input or integration node E conducting an electric current I to be integrated.

A switch 66, driven by a signal HDraz, is also provided in parallel with capacitor 64, for the discharge thereof, and thus its "resetting". Device 60 is completed by a sample-and-hold circuit 68 connected at the output of operational amplifier 62 to sample and hold voltage $V_{out}$ at the output thereof.

In addition to the CTIA integrator stage, device 60 comprises circuits 70 of automatic extension of the readout dynamic range of the CTIA 62, 64 alone. Circuit 70 comprises:
a circuit 72 inverting the direction of the connection of capacitor 64 across operational amplifier 62 on reception of a control signal HD[2:0];
a comparison circuit 74 detecting a switching condition of capacitor 64 according to the output voltage $V_{out}$ of amplifier 62 and generating control signal HD[2:0]; and
a circuit 76 storing the number of switchings of capacitor 64.
Switching circuit 72 comprises:
a first switch 78 driven by a signal HDinv, connected between the inverting input (−) of amplifier 62 and a first terminal 80 of capacitor 64;
a second switch 82 driven by a signal HDinv, connected between output 84 of amplifier 62 and a second terminal 86 of capacitor 64;
a third switch 88 driven by a signal $\overline{HDinv}$, connected between the inverting input (−) of amplifier 62 and second terminal 86 of capacitor 64;
a fourth switch 90, driven by a signal $\overline{HDinv}$, connected between output 86 of amplifier 62 and first terminal 80 of capacitor 64; and
a phase generator 92 receiving control signal HD[2:0] and generating control signals HDinv and $\overline{HDinv}$ as a function thereof.

In particular, signals HDinv and $\overline{HDinv}$ are in phase opposition. The switching of signal HDinv, and thus of signal $\overline{HDinv}$, accordingly causes the inversion of the connection state of capacitor 64, that is, the switching thereof.

Comparison circuit 74 comprises:
a comparator 94 receiving, on a first terminal (+), the output voltage $V_{out}$ of amplifier 62 and, on a second terminal (−), a reference voltage VREF greater than voltage VBUS and smaller than or equal to the high saturation voltage $V_{satH}$ of the CTIA. Comparator 94 outputs a voltage $S_{comp}$ having a first value when voltage $V_{out}$ is smaller than voltage VREF, and having a second value when voltage $V_{out}$ is greater than or equal to voltage VREF. In particular, the switching of voltage $S_{comp}$ from the first value to the second value means that voltage $V_{out}$ is increasing and has just crossed reference voltage VREF;
a binary counter 96, having its counting input connected to the output of comparator 94.

Finally, integration device 60 comprises an "auto-zero" circuit 98 connected to the inverting input (−) of amplifier 62, to suppress the offset of amplifier 62 and the low-frequency noise thereof as known per se, and for example described in document IEEE journal of solid-state circuits, vol sc-20, n° 3, June 1985.

The operation of device 60 will now be described in relation with FIGS. 4a and 4b of the state of the art.

Before starting a phase of integration of an electric current I, signals HDraz and HDinv are activated to the high state by generator 92.

The turning on of switch 66 discharges capacitor 64, and after this resetting, output voltage $V_{out}$ is equal to VBUS. Voltage VREF being greater than voltage VBUS, the output of comparator 94 is thus set to its lowest value. During this initialization phase, during which signal HDraz is activated to the high state, auto-zero system 98 is also implemented.

Control RAZ is then released, generator 92 triggers the turning off of switch 66 and keeps the state of signals HDinv and $\overline{HDinv}$. The turning off of switch 66 thus marks the beginning of the phase of integration of the current I received as an input, auto-zero system 98 is active to subtract the offset at the input of amplifier 62 during the entire integration phase. Generator 92 and switch 66 thus form an initialization circuit of the device which determines the time of the beginning of the integration period from the falling edge of signal RAZ to the rising edge of signal RAZ, which marks the final time of the integration period. Due to the integration, voltage $V_{out}$ at the output of amplifier 62 increases from value VBUS.

When, during the integration phase, output voltage $V_{out}$ reaches or exceeds value VREF, the output $S_{CO}MP$ of comparator 94 switches state, which propagates the high state at the comparator output to the input of the clock of binary counter 96, which then activates least significant bit HD0 to 1. One then has HD[2:0]=001.

The switching of a bit of signal HD[2:0] from the low state to the high state is detected by phase generator 92. As a response, the latter switches control signals HDinv and $\overline{HDinv}$ respectively to the low state and to the high state. This results in the switching of the connections of capacitor 64 between amplifier 62 and auto-zero circuit 98.

At the time when condition $V_{out}$=VREF is fulfilled, the quantity of electric charges Q stored in capacitor 64 is equal to:

$$Q = C_{int} \cdot (VREF - VBUS) \quad (2)$$

After the switching of capacitor 64, the load Q across the CTIA has a reverse biasing with respect to that discussed before the switching, so that the output of amplifier 62 is equal to:

$$V_{out} = 2 \cdot VBUS - VREF \quad (3)$$

The output of comparator 94 then switches to the low state since voltage $V_{out}$ is smaller than reference voltage VREF. The switching of capacitor 64 then takes the output of amplifier 62 to a lower level.

Beyond this time, the integration phase carries on, the output of amplifier 62 resuming its growth in the linear readout dynamic range, with no information loss.

If the output $V_{out}$ of amplifier 62 reaches or exceeds value VREF again before the end of the integration, the output $S_{COMP}$ of comparator 94 changes polarity again and increments counter 96 once again, and so on.

Once integration duration $T_{int}$ has elapsed, output voltage $V_{out}(T_{int})$ is sampled and held in sample-and-hold device 68 by the sending of a pulse for signal FSH while the binary values of signal HD[2:0] are also stored in a "latch"-type memory stage 76 on reception of the pulse of the same signal FSH. Device 60 thus supplies at the end of an integration phase a signal $HD_{SH}[2:0]$ representing the number of switchings of capacitor 64 as well as voltage $V_{outSH}$ equal to the voltage at the output of amplifier 62.

In the end, the total voltage $V_{out}^{final}$ corresponding to the electric charges integrated by CTIA 62, 64 during the integration phase is thus equal to:

$$V_{out}^{final} = V_{outSH} + 2 \cdot \text{conv}_{10}(HD_{SH}[2:0]) \times (VREF - VBUS) \quad (4)$$

where $\text{conv}_{10}(HD_{SH}[2:0])$ is the conversion to a decimal value of $HD_{SH}[2:0]$, that is, the number of switchings of the capacitor.

The equivalent readout dynamic range can thus be automatically increased by value $2 \cdot (2^n) \cdot (VREF - VBUS)$, or in other words multiplied by $2^n$, where n is the number of bits of binary counter 96, which may correspond to a much higher dynamic range than that of a conventional CTIA, according to the maximum value of the binary counter used and to the value of reference voltage VREF.

This device enables to obtain an autonomous automatic extension of the readout dynamic range of the CTIA according to the received electric charges, with no modification of the sensitivity of the signal-forming chain, in particular of the value of the capacitor and of the integration time. When the output voltage of the CTIA reaches the reference voltage, the capacitor is switched without being discharged.

The kept electric charges define, after the switching, a new output voltage of the CTIA, lower (when the output voltage is increasing) than that before the switching, from which the integration carries on. The useful output signal is determined according to the number of switchings, to the voltage decrement (or increment) generated by a switching, and optionally to the output voltage of the CTIA at the end of the integration time.

However, this device exhibits parasitic noise during switchings of the integration capacitor, which is visible on the output voltage.

In another different technical field, document WO 2017/135815 provides an electronic assembly of "analog-to-digital converter" type, where the input voltage to be converted may be comprised within a voltage range greater than the voltage range of the converter. For example, the input voltage range may be between −10 and +10 V while the analog-to-digital converter is only capable of converting voltages between −2.5 and +2.5 V.

To enable the analog-to-digital converter to convert all the voltage at the input of the assembly, a charge transfer is performed into a capacitor assembled in counter-feedback on the operational amplifier, to change the input voltage when the output voltage of the operational amplifier reaches a threshold value. By counting the charge transfers performed to modify the input voltage of the operational amplifier, it is possible to use an analog-to-digital converter associated with the charge transfer count to convert a wide range of input voltages by using an analog-to-digital converter with a smaller operating range.

Thus, the assembly of document WO 2017/135815 aims at increasing the input dynamic range of the circuit. Conversely, the invention aims at increasing the output dynamic range of the circuit by integrating an input current over an output voltage range larger than the output range available on the operational amplifier. In addition to this major difference, document WO 2017/135815 provides converting a voltage while the invention aims at integrating a current. Thus, document WO 2017/135815, instead of comprising an integrator assembly, only comprises an amplifier assembly.

The technical problem of the invention comprises obtaining a device of integration of an electric current received on an integration node which has an extended readout dynamic range without compromising the system sensitivity, while limiting the noise in the final delivered signal.

SUMMARY OF THE SPECIFICATION

To solve this problem, the invention provides replacing the mechanism of reversal of the integration capacitor with a circuit allowing a charge transfer into the integration capacitor.

For this purpose, the invention first concerns a device of integration of an electric current received on an integration node during an integration period, said device comprising:
  an operational amplifier having two inputs and one output; a first input being connected to said integration node and a second input being taken to a constant voltage;
  an integration capacitor connected between said first input and said output of said operational amplifier; said output delivering an output voltage which varies according to the variation of the quantities of charges in said integration capacitor;
  a circuit for modifying said output voltage;
  a comparison circuit configured to trigger said modification circuit at least once during said integration period when said output voltage is substantially equal to a reference voltage; and
  a storage circuit configured to store said number of triggerings which have occurred during said integration duration.

Said electric current received on said integration node is calculated according to said output voltage as well as to said number of triggerings multiplied by said modification of said output voltage induced by said modification circuit.

The invention is characterized in that the output voltage modification circuit is formed by a charge transfer circuit, configured to be connected on said integration node and to transfer charges into said integration capacitor when the comparison circuit detects that said output voltage is substantially equal to said reference voltage.

The charge injection into the integration capacitor enables to modify the output voltage and thus to extend the readout dynamic range without comprising the sensitivity of the system, while limiting the noise in the final delivered signal.

Further, conversely to the state of the art where the integration capacitor is reversed by controlled switches, the invention enables to use an integration circuit where the integration capacitor is permanently connected to the operational amplifier. Thereby, the invention enables to limit the noise of the final delivered signal inherent to the multiple switchings of the switches.

According to the invention, in the feature according to which the comparison circuit detects that said output voltage is substantially equal to said reference voltage, the term "substantially" refers to the measurement uncertainties of the circuit performing the comparison.

According to an embodiment, the modification circuit corresponds to a circuit comprising at least one switched capacitor comprising:
  means for charging said at least one switched capacitor configured to charge said at least one switched capacitor when said comparison circuit does not detect that said output voltage is substantially equal to said reference voltage; and
  means for discharging said at least one switched capacitor configured to connect said at least one switched capacitor on said integration node when said comparison circuit detects that said output voltage is substantially equal to said reference voltage.

Against all expectations, the inventors have observed that a simple switched capacitor circuit does not modify the complex behavior of an integrator assembly on transfer of charges into the integration capacitor. A switched capacitor circuit is also known as a "switched-capacitance circuit". The switched-capacitor circuit comprises a phase of charge of the switched capacitor and a phase of transfer of the charges of the switched capacitor into the integration capacitor. During the capacitor charge, the capacitor should be disconnected from the integration node. During the charge transfer, the capacitor should be connected on the integration node. Further, when the charge transfer is performed, the capacitor may be kept connected on the integration node without changing the behavior of the CTIA.

Thus, this embodiment enables to use the operation of a switched-capacitor circuit to efficiently transfer the charges necessary to modify the charges of the integration capacitor and, thus, to modify the output voltage without degrading the behavior of the CTIA.

According to an embodiment, the modification circuit corresponds to a switched-capacitor circuit, said modification circuit comprising:
  a first controlled switch connected between a low voltage and a first terminal of said switched capacitor;
  a second controlled switch connected between said constant voltage and a second terminal of said switched capacitor;
  a third controlled switch connected between a high voltage and said first terminal of said switched capacitor; and
  a fourth controlled switch connected between said integration node and said second terminal of said switched capacitor;
  said first and second switches being controlled when said comparison circuit does not detect that said output voltage is substantially equal to said reference voltage to charge said switched capacitor to a voltage value corresponding to said low voltage decreased by said constant voltage;
  said third and fourth switches being controlled when said comparison circuit detects that said output voltage is substantially equal to said reference voltage to perform a charge transfer from said switched capacitor into said integration capacitor.

This embodiment enables to use a single additional capacitor per integration device to transfer the charges necessary for the modification of the output voltage.

In this embodiment, the CTIA should generate a charge variation at its input since the connection of the switched capacitor on the integration node modifies the charge at the input of the CTIA as a comparison with the phase when the switched capacitor is not connected on the CTIA.

To solve this problem, according to an embodiment, the modification circuit corresponds to a circuit comprising two switched capacitors, said modification circuit comprising:
  a first controlled switch connected between a low voltage and a first terminal of a first switched capacitor;
  a second controlled switch connected between said constant voltage and a second terminal of said first switched capacitor;
  a third controlled switch connected between a high voltage and said first terminal of said first switched capacitor;
  a fourth controlled switch connected between said integration node and said second terminal of said first switched capacitor;
  a fifth controlled switch connected between said high voltage and a first terminal of a second switched capacitor;
  a sixth controlled switch connected between said low voltage and said first terminal of said second switched capacitor;
  a seventh controlled switch connected between said constant voltage and a second terminal of said second switched capacitor; and
  an eighth controlled switch connected between said integration node and said second terminal of said second switched capacitor;
  said first, second, fifth, and eighth switches being controlled when said comparison circuit does not detect that said output voltage is substantially equal to said reference voltage to charge said first switched capacitor and to perform a charge transfer from said second switched capacitor into said integration capacitor;
  said third, fourth, sixth, and seventh switches being controlled when said comparison circuit detects that said output voltage is substantially equal to said reference voltage to charge said second switched capacitor and to perform a charge transfer from said first switched capacitor into said integration capacitor.

This embodiment enables to limit charge variations at the input of the CTIA since the integration node is always connected to one or the other of the switched capacitors.

When a switched capacitor has performed a charge transfer into the integration capacitor, it remains connected to the integration node while the other switched capacitor is charged to be connected to the integration node at the next transition. Thus, it is not necessary to disconnect the switched capacitor which has performed a charge transfer, which limits charge variations on the CTIA and on the high and low voltages.

According to an embodiment, said two switched capacitors have substantially identical capacitance values. This embodiment enables to obtain charge variations which are close to zero at the input of the CTIA and on the high and low voltages.

The high and low voltages must comply with different constraints, since the low voltage has to charge the switched capacitor while the high voltage should allow the charge transfer from the switched capacitor to the integration capacitor.

According to an embodiment, the integration device comprises a generator of said low voltage comprising a settling time longer than the settling time of a generator of said high voltage.

To allow an efficient charge transfer, it is preferably for the settling time of the high voltage generator to be as short as possible. On the contrary, the settling time of the low voltage generator may be longer since the charge time of the switched capacitor is longer than the charge transfer time.

According to an embodiment, said generator of the high voltage and said generator of the low voltage are configured to supply said low and high voltages of a plurality of integration devices.

This embodiment enables to pool the low and high voltage generation circuit for a plurality of integration devices, for example, in the context of the use of an array network comprising rows and columns with pooled integration devices for each column or for each row.

According to an embodiment, said generator of the high voltage and/or said generator of the low voltage comprise at least one capacitor for decoupling the high voltage and/or the low voltage.

This embodiment enables to improve the generator settling time by using decoupling capacitors with high values, for example, in the range from 10 μF to 100 μF.

According to an embodiment, the modification circuit corresponds to a current injection circuit comprising a current generator and a switch connected between said current generator and said integration node; said switch being controlled by said comparison circuit to connect said current generator on said integration node when said comparison circuit detects that said output voltage is substantially equal to said reference voltage.

Against all expectations, the inventors have observed that a current generator does not modify the complex behavior of an integrator assembly on transfer of charges into said integration capacitor.

Thus, this embodiment enables to use a simple current generator to efficiently transfer the charges necessary to modify the output voltage without degrading the behavior of the CTIA.

Further, as compared with a switched-capacitor circuit, this embodiment is very simple to implement.

According to an embodiment, the current generator is formed by a current mirror assembly.

This embodiment enables to match the output impedance of the current generator to limit the disturbances of the CTIA.

The invention also aims at an electromagnetic radiation detection system, comprising:
- a detection element generating on an output terminal an electric current according to the electromagnetic radiation; and
- a device of the above-described type, the first input terminal of the operational amplifier being capable of being connected to the output terminal of the detection element for the integration of the current generated by the detection element.

Particularly, the detection element comprises:
- a detection branch, comprising a detection bolometer having a membrane suspended above a substrate and a bias circuit for setting the voltage across the detection bolometer according to a voltage set point;
- a compensation branch, comprising a compensation bolometer substantially taken to the substrate temperature, and a bias circuit for setting the voltage across the compensation bolometer according to a voltage set point;
- and means for forming the difference between the current running through the detection bolometer and the current running through the compensation bolometer to form the electric current to be integrated.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION

Figure 1:
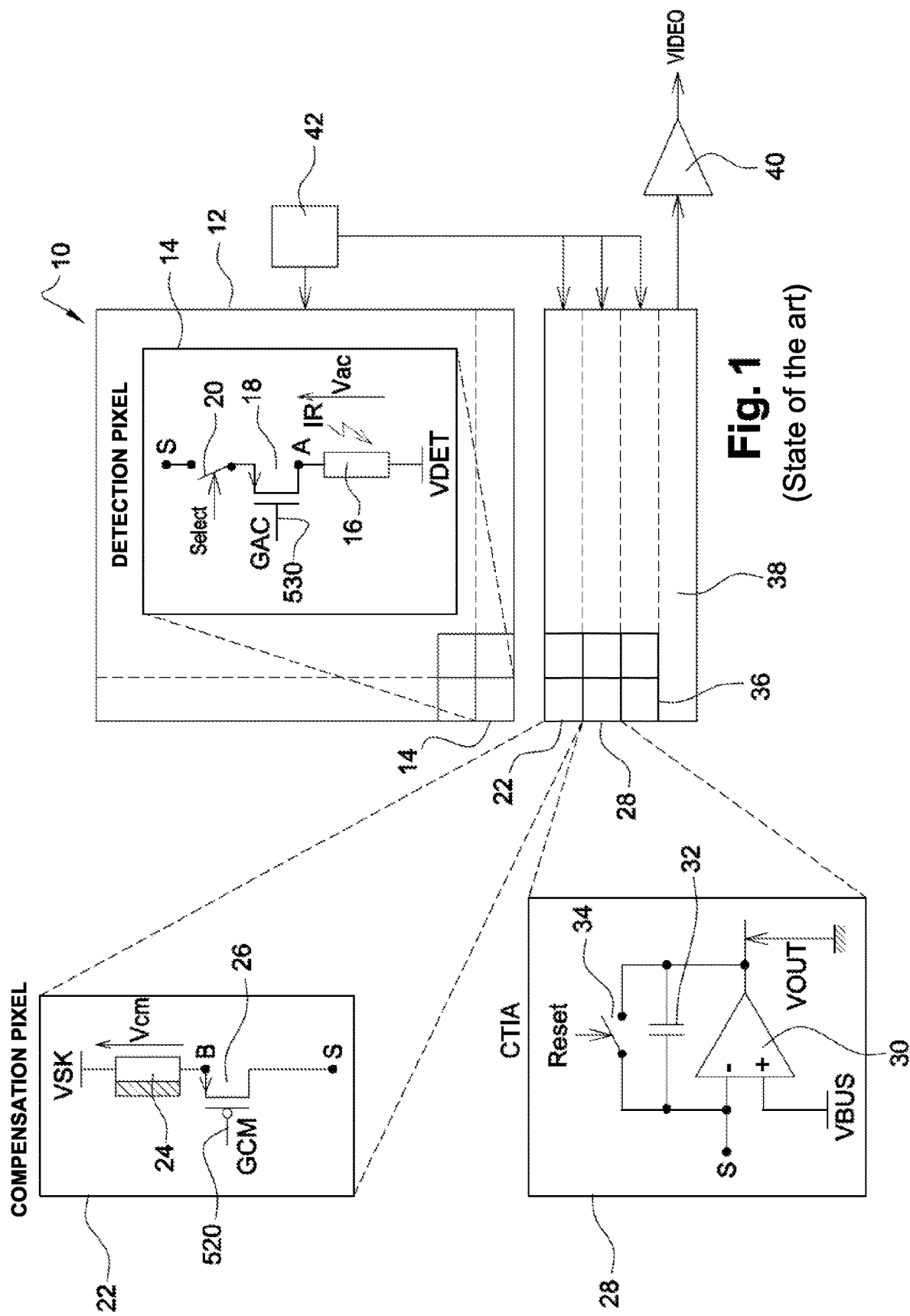
FIG. 1 is an electric diagram of an infrared bolometric detector of the state of the art comprising CTIA-type integrators for the measurement of the currents generated by the detection elements.
Figure 2:
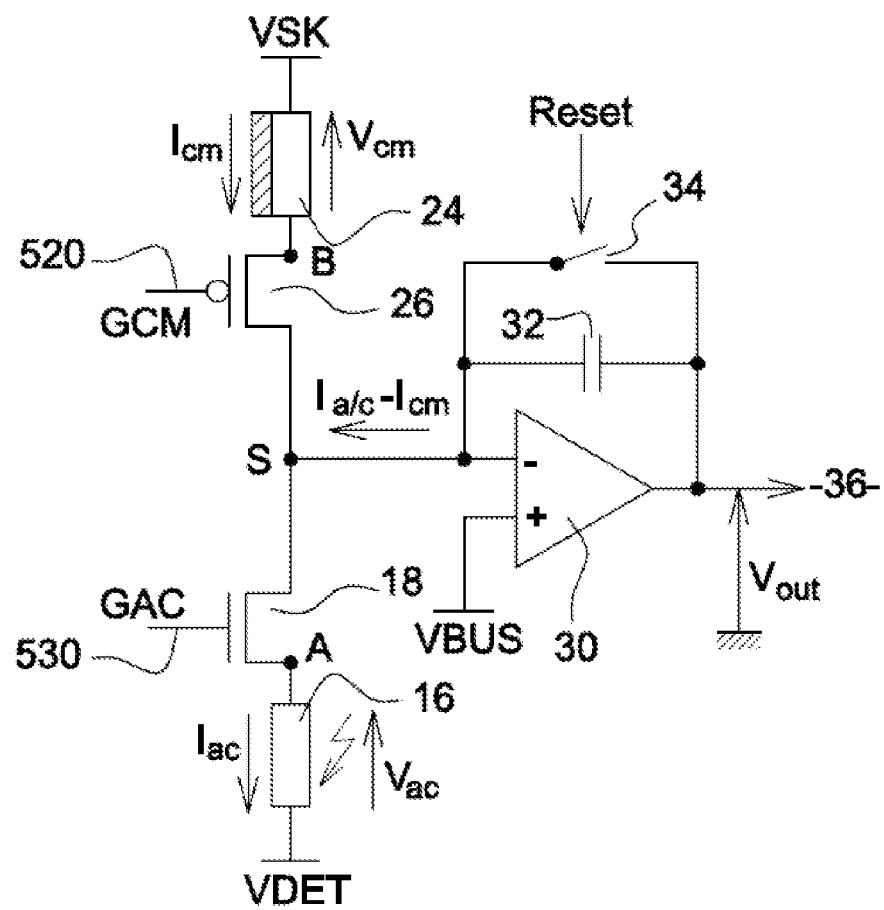
FIG. 2 is an electric diagram illustrating the reading out of a sensitive bolometer of the detector of FIG. 1 by means of a compensation structure.
Figure 3:
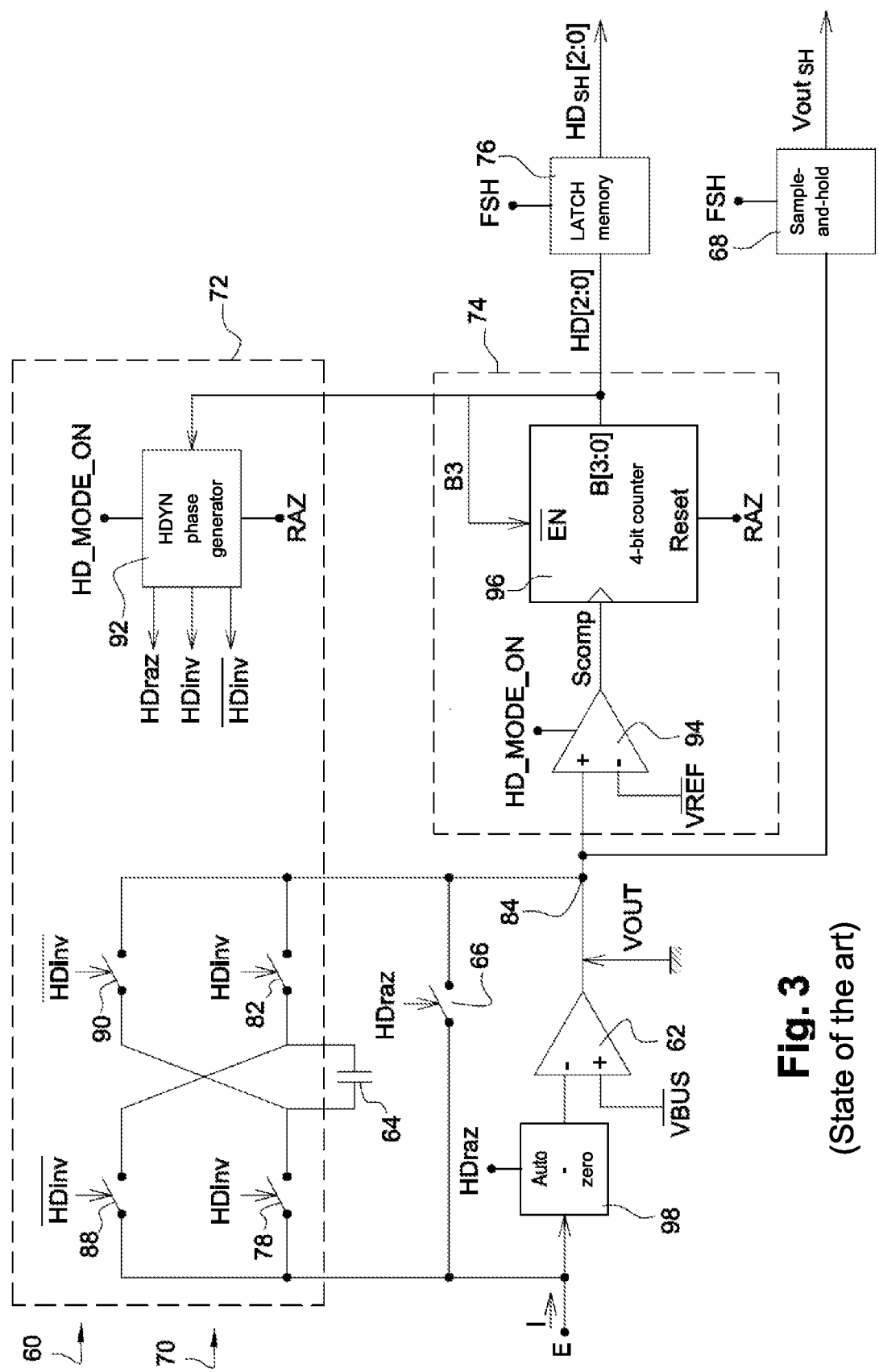
FIG. 3 is an electric diagram of an optimized electric current integration device of the state of the art.

The invention concerns an integration device having an increased dynamic range by using the principle described in reference with FIG. 3, where the reversing of integration capacitor 64 is replaced with a circuit of charge transfer into integration capacitor 64.

Figure 5:
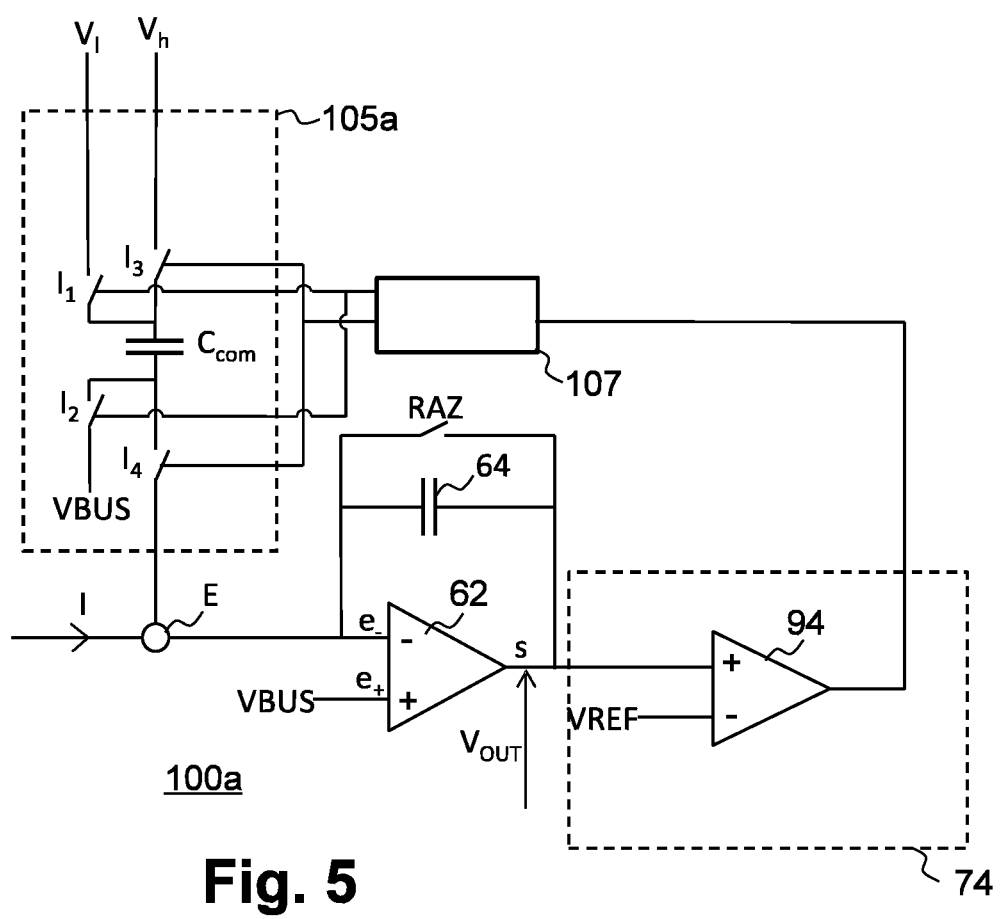
FIG. 5 is an electric diagram of an electric current integration device according to a first embodiment of the invention.
Figure 6:
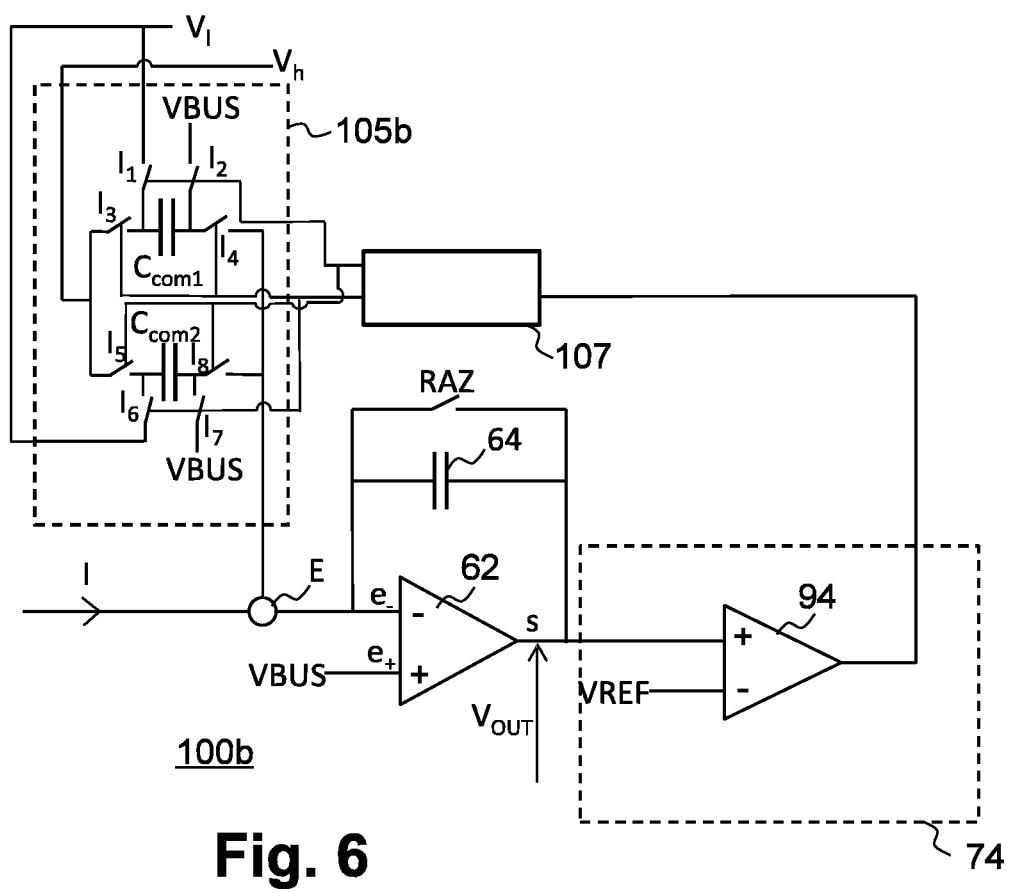
FIG. 6 is an electric diagram of an electric current integration device according to a second embodiment of the invention.
Figure 7:
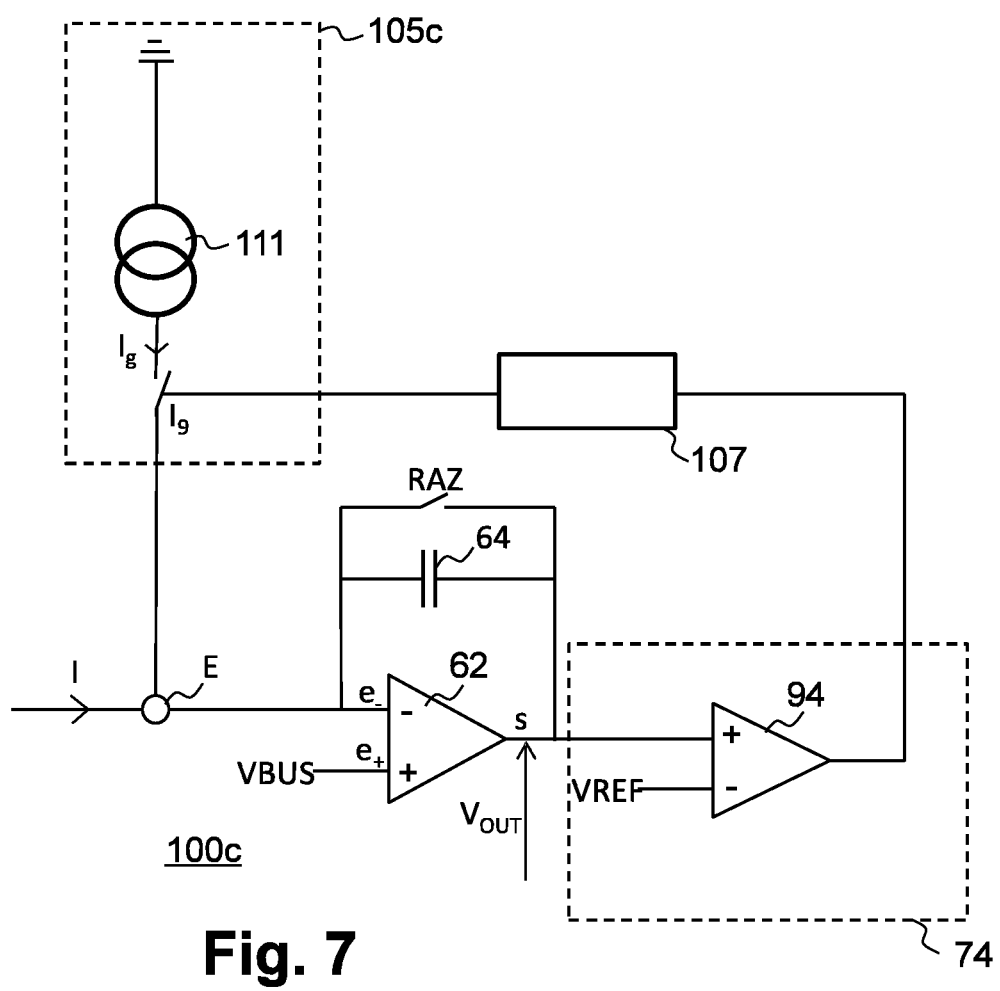
FIG. 7 is an electric diagram of an electric current integration device according to a third embodiment of the invention.

FIGS. 5 and 6 illustrate two embodiments where the charge transfer is obtained by the connection of a charged capacitor on the integration node, while FIG. 7 illustrates an embodiment where the charge transfer is obtained by the injection of a current on integration node E.

In the case of FIG. 5, an integration device 100a comprises a CTIA-type integrator comprising an operational amplifier 62 and a capacitor 64, of fixed capacitance Cint, connected between the inverting input e− and the output of amplifier 62. The non-inverting input e+ thereof is connected to a constant positive voltage VBUS and the inverting input e− is connected to the input or integration node E conducting an electric current I to be integrated. A switch RAZ is provided in parallel with capacitor 64, for the discharge thereof, and thus its "resetting".

Device 100a is preferably completed by a sample and hold circuit (not shown) connected to the output of operational amplifier 62 to sample and hold voltage Vout at the output thereof.

In addition to the CTIA integrator stage, device 100a is completed by means of automatic extension of the readout dynamic range of CTIA 62, 64 alone, comprising:
- a switched-capacitor circuit 105a capable of being connected on integration node E to perform a charge transfer into capacitor 64;
- a comparison circuit 74 detecting a condition of charge transfer into capacitor 64 according to the output voltage Vout of amplifier 62;
- a phase generator circuit 107 enabling to control switched-capacitor circuit 105a according to the comparison circuit; and
- a circuit, not shown, storing the number of injections on integration node E.

Switched-capacitor circuit 105a comprises:
- a capacitor Ccom;
- a first controlled switch 11 connected between a low voltage Vl and a first terminal of capacitor Ccom;
- a second controlled switch 12 connected between a constant voltage VBUS and a second terminal of capacitor Ccom;
- a third controlled switch 13 connected between a high voltage Vh and the first terminal of capacitor Ccom; and
- a fourth controlled switch 14 connected between integration node E and the second terminal of capacitor Ccom.

The first and second switches are controlled in a way similar and opposite to the control of the third and fourth switches. For example, as illustrated in FIG. 6, the switches are controlled by a non-overlapping phase generator circuit 107.

By means of phase generator circuit 107, the first and second switches, which have the same state, are turned off while the third and fourth switches, which have the same state, are turned on, and conversely.

Preferably, comparison circuit 74 comprises a comparator 94 receiving on a first terminal (+) the output voltage Vout of amplifier 62 and, on a second terminal (−) a reference voltage VREF greater than voltage VBUS and smaller than or equal to the high saturation voltage VsatH of the CTIA. A binary counter (not shown) is connected to the output of comparator 94 to count the number of times that output voltage Vout reaches reference voltage VREF.

As long as output voltage Vout is smaller than reference voltage VREF, phase generator circuit 107 controls the third and fourth switches to the on state, and capacitor Ccom charges to the next value:

$$Q\text{init}=C_{com}(Vl-VBUS)$$

When output voltage Vout is equal to reference voltage VREF, comparison circuit 74 transmits a signal to phase generator circuit 107 which controls, for a predetermined duration, the turning on of the first and second switches and the turning off of the third and fourth switches. The new charge of capacitor Ccom becomes equal to:

$$Q\text{final}=C_{com}(Vh-VBUS)$$

Thereby, the turning on of the first and second switches and the turning off of the third and fourth switches induce a charge variation in capacitor Ccom corresponding to the following equation:

$$\Delta Q=Q\text{final}-Q\text{init}=C_{com}(Vh-Vl)$$

This charge variation is transmitted by CTIA amplifier 62 into integration capacitor 64. At the output of amplifier 62, the variation ΔVout of output voltage Vout follows relation:

$$\Delta V_{out}=-C_{com}/C_{init}(Vh-Vl)$$

By setting the value of high and low voltages Vh and Vl and the value of the capacitance of capacitor Ccom, it is possible to parameterize the variation of output voltage Vout so that output voltage Vout is always contained between the saturation values of amplifier 62.

Thus, before amplifier 62 enters the saturation phase, output voltage Vout is modified and amplifier 62 keeps on integrating current I from the new value of its output voltage Vout.

To obtain the final value of the current I integrated by device 100a, it is sufficient to measure output voltage Vout and to add a value corresponding to the number of performed charge transfers multiplied by variation ΔVout of output voltage Vout.

Figure 4A:
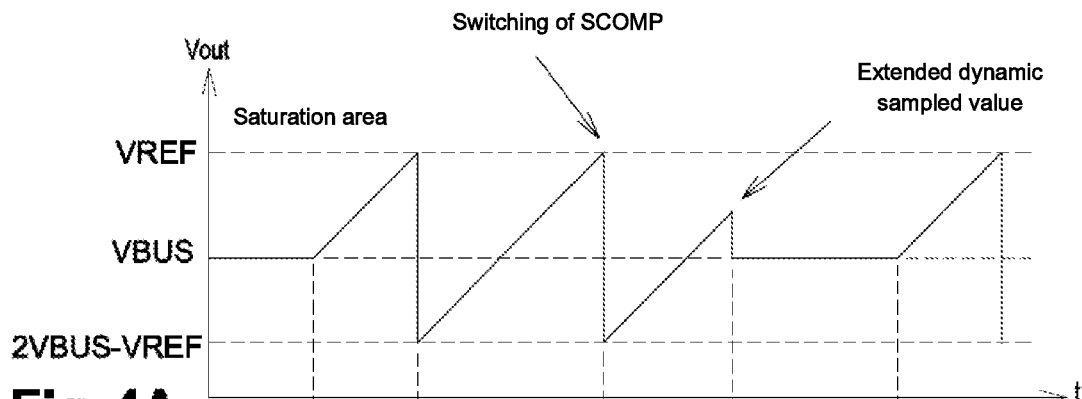
FIGS. 4A and 4B are, respectively, a timing diagram illustrating the output signal of the integration stage and the signal for resetting the device of FIG. 3.
Figure 4B:
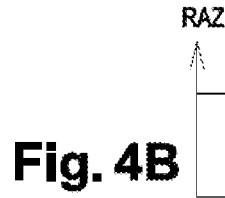

The predetermined duration is defined so that the charge of capacitor Ccom can be transferred into capacitor 64 to modify output voltage Vout. As a result of this charge transfer phase, capacitor Ccom is disconnected from integration node E and capacitor Ccom charges. The behavior of output voltage Vout may thus be similar to that described in reference to FIGS. 4a and 4b, that is, with a plurality of growth phases separated by phases of modification of output voltage Vout before amplifier 62 enters the saturation phase. As a variant, output voltage Vout may have a decreasing behavior over time with a local increase of output Vout by switched-capacitor circuit 105a before reaching the low saturation voltage of amplifier 62.

In the example of FIG. 5, phase generator circuit 107 controls the switches. As a variant, other logic circuits may be used to control the switches according to comparison circuit 74 without changing the invention. For example, a buffer and a logic inverter may be arranged at the output of comparison circuit 74 to directly control the switches.

The device of FIG. 5 exhibits high and low voltages Vh and Vl used by switched-capacitor circuit 105a.

High and low voltages Vh and Vl may be generated by follower, inverter assemblies, or any other voltage generator assembly. The two voltage generator assemblies may have different behaviors since the generator of low voltage Vl is used to charge capacitor Ccom while the generator of high voltage Vh is used during charge transfers. It is thus preferable for the generator of high voltage Vh to have the shortest possible settling time, conversely to the generator of low voltage Vl, which may charge capacitor Ccom for a much longer time without decreasing the readout dynamic range.

In the context of a general system, a plurality of integration devices may be used in parallel in an array network comprising rows and columns.

Preferably, the two voltage generator assemblies are configured to deliver the low and high voltage Vl and Vh of all the integration devices of a column. Preferably, decoupling capacitors are provided on low and high voltages Vl and Vh when the amplifier charge is significant.

FIG. 6 illustrates a second embodiment of the invention where switched capacitor circuit 105b comprises:
- two capacitors Ccom1, Ccom2 having a substantially identical value;
- a first controlled switch 11 connected between low voltage Vl and the first terminal of a first capacitor Ccom1;

a second controlled switch 12 connected between constant voltage VBUS and a second terminal of first capacitor Ccom1;

a third controlled switch 13 connected between high voltage Vh and the first terminal of first capacitor Ccom1;

a fourth controlled switch 14 connected between integration node E and the second terminal of first capacitor Ccom1;

a fifth controlled switch 15 connected between high voltage Vh and a first terminal of a second capacitor Ccom2;

a sixth controlled switch 16 connected between low voltage Vl and the first terminal of second capacitor Ccom2;

a seventh controlled switch 17 connected between constant voltage VBUS and a second terminal of second capacitor Ccom2; and an eighth controlled switch 18 connected between integration node E and the second terminal of second capacitor Ccom2.

The first, second, fifth, and eighth switches are controlled in a way similar and opposite to the control of the third, fourth, sixth and seventh switches.

For example, the first, second, fifth, and eighth switches are directly controlled by a first signal of phase generator circuit 107 while the third, fourth, sixth, and seventh switches are controlled by a second complementary signal of phase generator circuit 107.

Thus, the first, second, fifth, and eighth switches, which have the same state, are off while the third, fourth, sixth, and seventh switches, which have the same state, are on, and vice versa.

Conversely to the embodiment of FIG. 5, the embodiment of FIG. 6 always has a capacitor connected to integration node E. When a previously-charged capacitor Ccom1, Ccom2 is connected to integration node E, the charges of this capacitor are transferred to capacitor 64. Due to this charge transfer phase, the connection of the capacitor on integration node E has no impact on the integrator assembly. Thus, the operating equations of the second embodiment of FIG. 6 are identical to the operations described in relation with the first embodiment of FIG. 5.

In the two embodiments of FIGS. 5 and 6, the charge transfer to capacitor 64 is performed by a circuit comprising one or a plurality of switched capacitors. As a variant, a current injection circuit may be used to perform the charge transfer, as illustrated in FIG. 7.

The current injection circuit 105c of FIG. 7 comprises a current generator 111 delivering a current Ig on integration node E when a switch 19 is on.

Current generator 111 may be formed by a current mirror assembly, for example, with a PMOS transistor.

Switch 19 is controlled by a phase generator circuit 107, similar to the previously-described circuit. When comparison circuit 74 detects that output voltage VOUT is substantially equal to reference voltage VREF, current generator 111 is connected to the integration node for a predetermined time T. Predetermined time T is rated by a clock signal in phase generator circuit 107, and enables to define the quantity of charges transferred into capacitor 64. Conversely to the previous embodiments, there is no limit to the charges that can be transferred into capacitor 64 and it is particularly important to accurately define time T.

When switch 19 is on, current generator 111 transmits a DC current on integration node E, thus modifying the charges of integration capacitor 64. The variation of output voltage VOUT of the integrator assembly corresponds to the following formula:

$$\Delta V_{out} = I_g \cdot T / C_{int}$$

By determining the values of time T and of current Ig, it is thus possible to reach a desired variation ΔVout of the voltage at the output Vout of the integrator assembly.

As previously, to obtain the final value of the current I integrated by device 100c, it is sufficient to measure output voltage Vout and to add a value corresponding to the number of performed charge transfers multiplied by variation ΔVout of output voltage Vout.

Given the component tolerances, it may be desired to practically measure voltage variation ΔVout to accurately define the final value of current I, integrated by one of devices 100a-100c.

Figure 8:
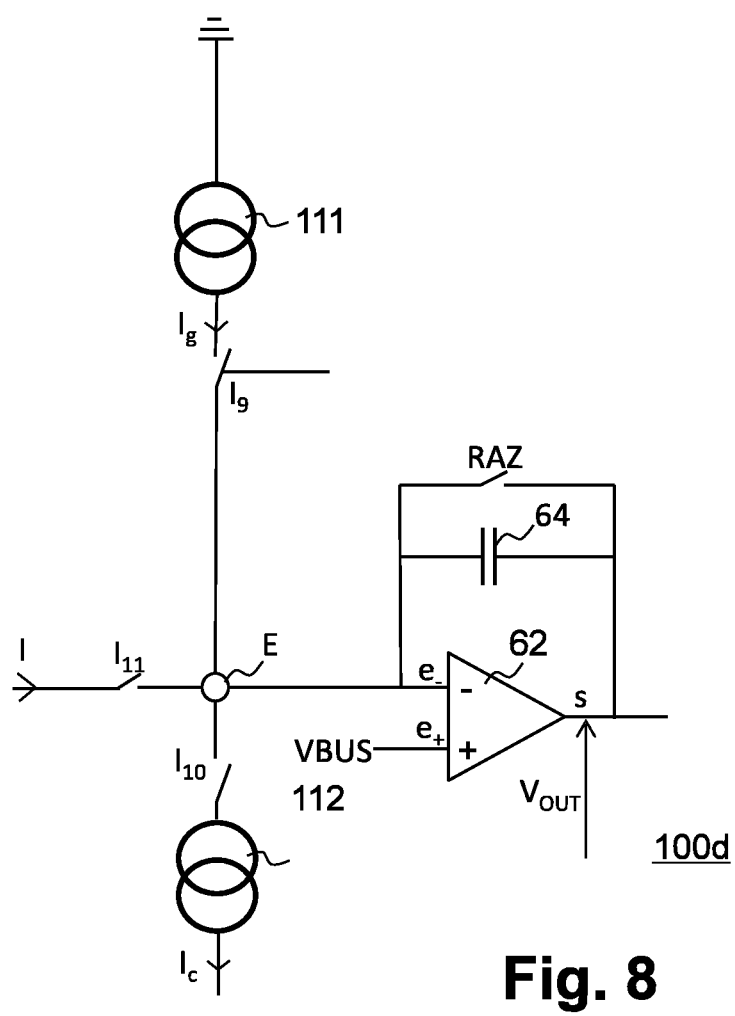
FIG. 8 is an electric diagram of the integration device of FIG. 7 in a calibration phase.

To perform this measurement, as illustrated in FIG. 8, a current source 112 may be connected on integration node E to inject a current Ic.

Figure 9:
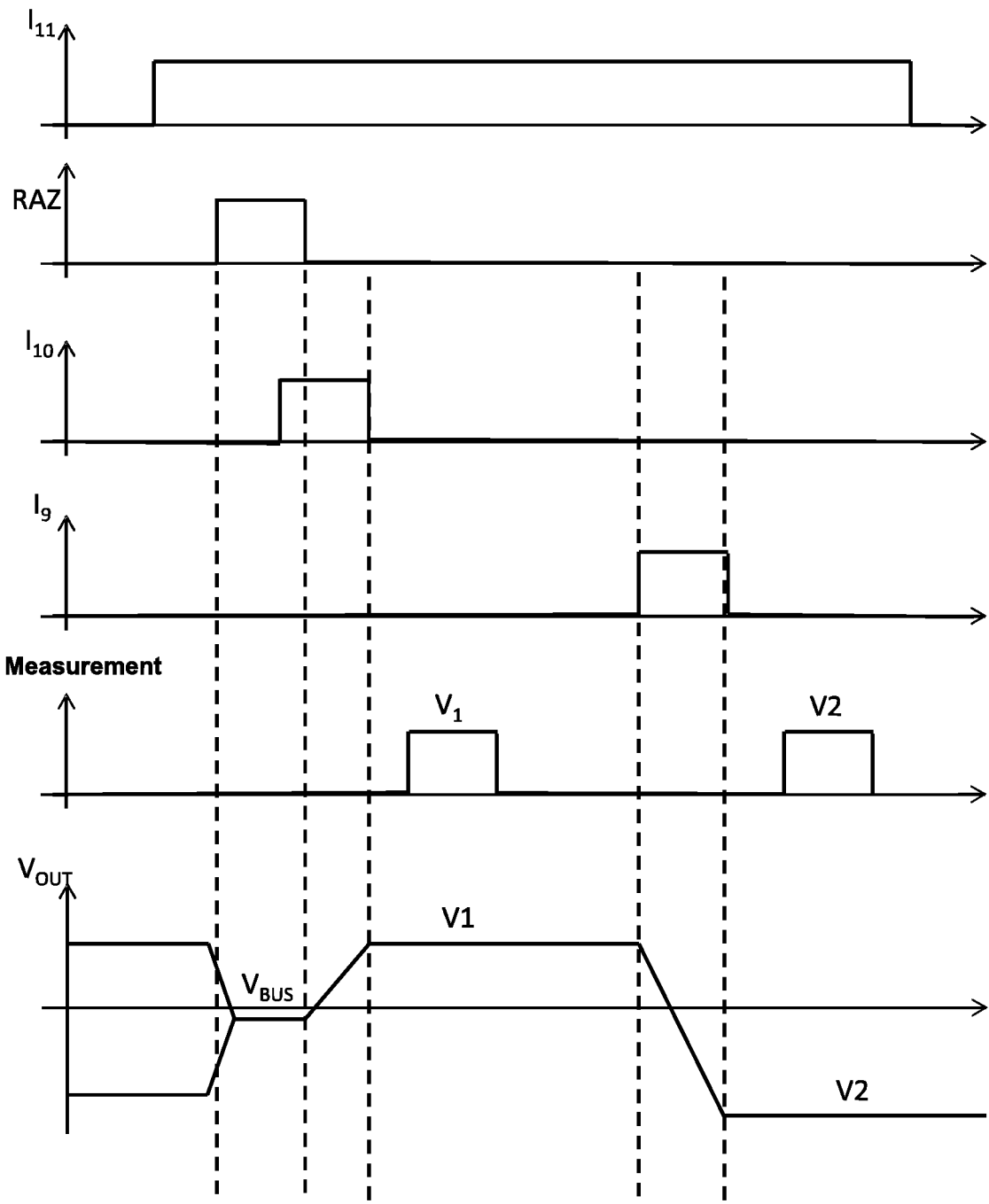
FIG. 9 is a timing diagram illustrating the different signals used to perform the calibration of the integration device of FIG. 7.

As illustrated in FIG. 9, a first step comprises isolating the CTIA from current I by turning off switch 111. At this time, output Vout is variable and depends on current I. Reset switch RAZ is then turned on to short-circuit capacitor 64 and take output Vout to voltage VBUS, present on input e+ of amplifier 62, while switches 19 and 110 are off.

To measure high voltage V1, only switch 110 is on while reset signal RAZ is off. The value of current Ic matters little, it is sufficient to exceed the switch threshold of comparator 94. Thus, output voltage Vout progressively rises up to the switching threshold of comparator 94.

When comparator 94 switches, current source 112 is disconnected from integration node E by the turning off of switch 110 and output value Vout is measured to obtain the value of high voltage Vl.

To measure low voltage V2, only switch 19 is on while reset signal RAZ is off. Thus, output voltage Vout progressively decreases down to the switching threshold of comparator 94 under the effect of current source 111. As a variant, current source 111 may be replaced with a switched-capacitor circuit, as illustrated in FIG. 5 or 6, in the context of a measurement of the voltage variation ΔVout of one of these assemblies.

When comparator 94 switches, current source 111 is connected to integration node E by the turning on of switch 19 for a predetermined time T. Switch 19 is then turned off and output value Vout is measured to obtain the value of high voltage V2.

The value of ΔVout is measured by the difference between high voltage V1 decreased by low voltage V2.

In the case of a measurement of the voltage variations of a plurality of successive columns, it should be noted that the measurement should not be performed simultaneously on all columns, since the current inrush variations may alter the measurements. It is thus necessary to measure each voltage variation ΔVout of each column one after the other.

Eventually, the value of the voltage variation ΔVout of each readout circuit is saved to calculate the final value of the integration.

As a result, with the present invention, a detector for integrating the electric current originating from a critical site, for example, a bolometer, has a number of advantages over prior art reading circuits, in particular:

the access to an extended scene dynamic range while keeping a high sensitivity on the image portion that can be transcribed in the nominal electric dynamic range of the CTIA alone while the linearity of the signal according to the flow is kept, conversely to certain logarithmic response systems, for example;

the frame frequency (defined by the number of times when the entire array is read within one second) is kept identical to usual standards (60 Hz, for example). In other words, there is no degradation of the information time density with respect to certain forms of the state of the art in terms of dynamic range extension;

the obtained scene information is kept in permanent time consistency or synchronicity with the scene. Indeed, the time interval separating any event in the scene from the forming of the signal usable by the observer or the system using the output flow of signals Vout does not exceed a frame time, conversely to all detectors or systems having a data flow which is oversampled and/or processed by calculation after the forming of the raw signals to obtain the information considered as usable with an extended dynamic range;

a simplification of the use of the detector; indeed, in the state of the art, the user should generally himself select the operating point of the detector according to the observed scene temperature range. Generally, to give a general idea, three different operating points are necessary to cover the dynamic range [−40° C.; +1,000° C.] with no saturation;

as compared with methods of the technical field based on the adaptation of the integration time, the invention provides the advantage of not modifying the thermal cycle of the bolometer imposed by the self-heating by Joule effect during the integration cycle. Such a feature is particularly advantageous in terms of stability of the continuous level according to the ambient thermal operating conditions, in particular, when small scene temperature differences are searched for with a good time stability. The efficiency of the possible implementation of the detector with no Peltier stabilization module (so-called TEC-less operation), more and more current in the field, is thus kept;

there is no resetting noise on inversion of the integration capacitance, as in certain forms of prior art, since the latter is never emptied, until after the time when signal Vout is sampled;

further, the stray capacitances for example formed by the gates of the connection switches and the actual connections form an integral part of the integration capacitor and add no parasitic disturbance. The signal formed at the output thus looses no form of quality by application of the invention.

The invention claimed is:

1. A device for integrating an electric current received on an integration node during an integration period Tint, said device comprising:
    an operational amplifier having two inputs and one output; a first input being connected to said integration node and a second input being taken to a constant voltage;
    an integration capacitor connected between said first input and said output of the operational amplifier; said output delivering an output voltage which varies according to the variation of the quantity of charges in said integration capacitor;
    a modification circuit for modifying said output voltage;
    a comparison circuit configured to trigger said modification circuit at least once during said integration period when said output voltage is substantially equal to a reference voltage; and
    a storage circuit configured to store a number of triggerings which have occurred during said integration period;
said electric current received on the integration node being calculated according to said output voltage as well as to said number of triggerings multiplied by said modification of said output voltage induced by said modification circuit;
wherein the circuit for modifying said output voltage is formed by a charge transfer circuit, configured to be connected on said integration node and to transfer charges into said integration capacitor when the comparison circuit detects that said output voltage is substantially equal to said reference voltage.

2. The electric current integration device according to claim 1, wherein the modification circuit corresponds to a circuit comprising at least one switched capacitor comprising:
    means for charging said at least one switched capacitor configured to charge said at least one switched capacitor when said comparison circuit does not detect that said output voltage is substantially equal to said reference voltage; and
    means for discharging said at least one switched capacitor configured to connect said at least one switched capacitor on said integration node when said comparison circuit detects that said output voltage is substantially equal to said reference voltage.

3. The electric current integration device according to claim 2, wherein the modification circuit corresponds to a circuit comprising a switched capacitor, said modification circuit comprising:
    a first controlled switch connected between a low voltage and a first terminal of said switched capacitor;
    a second controlled switch connected between said constant voltage and a second terminal of said switched capacitor;
    a third controlled switch connected between a high voltage and the first terminal of said switched capacitor; and
    a fourth controlled switch connected between said integration node and said second terminal of said switched capacitor;
said first and second switches being controlled when the comparison circuit does not detect that said output voltage is substantially equal to said reference voltage to charge said switched capacitor to a voltage value corresponding to said low voltage decreased by said constant voltage;
said third and fourth switches being controlled when said comparison circuit detects that said output voltage is substantially equal to said reference voltage to perform a charge transfer from said switched capacitor into said integration capacitor.

4. The electric current integration device according to claim 2, wherein the modification circuit corresponds to a circuit comprising two switched capacitors, said modification circuit comprising:
    a first controlled switch connected between a low voltage and a first terminal of a first switched capacitor; a second controlled switch connected between said constant voltage and a second terminal of said first switched capacitor;
    a third controlled switch connected between a high voltage and said first terminal of said first switched capacitor;
    a fourth controlled switch connected between said integration node and said second terminal of said first switched capacitor;

a fifth controlled switch connected between said high voltage and a first terminal of a second switched capacitor;

a sixth controlled switch connected between said low voltage and said first terminal of said second switched capacitor z;

a seventh controlled switch connected between said constant voltage and a second terminal of said second switched capacitor; and an eighth controlled switch connected between said integration node and said second terminal of said second switched capacitor;

said first, second, fifth, and eighth switches being controlled when said comparison circuit does not detect that said output voltage is substantially equal to said reference voltage to charge said first switched capacitor and to perform a charge transfer from said second switched capacitor into said integration capacitor;

said third, fourth, sixth, and seventh switches being controlled when the comparison circuit detects that said output voltage is substantially equal to said reference voltage to charge said second switched capacitor and to perform a charge transfer from said second switched capacitor into said integration capacitor.

5. The electric current integration device according to claim, 4, wherein said two switched capacitors have substantially identical capacitance values.

6. The electric current integration device according to claim 3, wherein said integration device comprises a generator of the low voltage having a settling time longer than the settling time of a generator of the high voltage.

7. The electric current integration device according to claim 6, wherein said generator of the low voltage and said generator of the high voltage are configured to supply said low and high voltages of a plurality of integration devices.

8. The electric current integration device according to claim 6, wherein said generator of the low voltage and/or said generator of the high voltage comprise at least one transistor for decoupling the low voltage and/or the high voltage.

9. The electric current integration device according to claim 1, wherein said modification circuit corresponds to a current injection circuit comprising a current generator and a switch connected between said current generator and said integration node; said switch being controlled by the comparison circuit to connect said current generator on said integration node when said comparison circuit detects that said output voltage is substantially equal to said reference voltage.

10. The electric current integration device according to claim 9, wherein said current generator is formed by a current mirror assembly.

11. An electromagnetic radiation detection system comprising:

a detection element generating on an output terminal an electric current according to the electromagnetic radiation; and a device according to any of the foregoing claims, the first input of the operational amplifier being connected to the output terminal of the detection element for the integration of the current generated by the detection element.

12. The electromagnetic radiation detection system of claim 11, wherein the detection element comprises:

a detection branch comprising a detection bolometer having a membrane suspended above a substrate and a bias circuit for setting the voltage across the detection bolometer according to a voltage set point;

a compensation branch comprising a compensation bolometer substantially taken to the substrate temperature, and a bias circuit for setting the voltage across the compensation bolometer according to a voltage set point; and means for forming the difference between the current running through the detection bolometer and the current running through the compensation bolometer to form the electric current to be integrated.

* * * * *